(12) United States Patent
Cabral, Jr. et al.

(10) Patent No.: US 8,772,161 B2
(45) Date of Patent: Jul. 8, 2014

(54) ANNEALING COPPER INTERCONNECTS

(75) Inventors: Cyril Cabral, Jr., Mahopac, NY (US);
Gregory M. Fritz, Yorktown Heights, NY (US); Christian Lavoie, Ossining, NY (US); Conal E. Murray, Yorktown Heights, NY (US); Kenneth P Rodbell, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 382 days.

(21) Appl. No.: 13/205,063

(22) Filed: Aug. 8, 2011

(65) Prior Publication Data

US 2013/0040454 A1  Feb. 14, 2013

(51) Int. Cl.
*H01L 21/44* (2006.01)

(52) U.S. Cl.
USPC ............ 438/662; 438/663; 438/676; 438/687

(58) Field of Classification Search
USPC .......................... 438/625, 662, 663, 676, 687
See application file for complete search history.

(56) References Cited

U.S. PATENT DOCUMENTS 5,538,795 A    7/1996 Barbee, Jr. et al.
2009/0235915 A1*  9/2009 Doumanidis et al. .... 126/263.01

OTHER PUBLICATIONS

Wang et al., Effects of Physical Properties of Components on Reactive Nanolayer Joining, J. Appl. Phys. 97, 114307 (2005), Abstract.
Gavens et al., Effect of Intermixing on Self-Propagating Exothermic Reactions in Al/Ni Nanolaminate Foils, J. Appl. Phys. 87, 1255 (2000), Abstract.
Kim et al., Thermite Reaction Between CuO Nanowires and Al for the Crystallization of a-Si, Transactions on Electrical and Electronic Materials, vol. 11, No. 5, pp. 234-237, Oct. 25, 2010.
Trenkle et al., Time-Resolved X-Ray Microdiffraction Studies of Phase Transformations During Rapidly Propagating Reactions in Al/Ni and Zr/Ni Multilayer Foils, Journal of Applied Physics 107, 113511 (2010), pp. 1-12.
Moore et al. Combustion Synthesis of Advanced Materials: Part I, Reaction Parameters, Prog. Mat. Sci. 39 (1995) 243.
Moore et al. Combustion Synthesis of Advanced Materials: Part II, Classification, Applicants and Modelling, Prog. Mat. Sci 39 (1995) 275.
Rogachev et al. Combustion of Heterogeneous Nanostructural Systems, Combust. Explo. Shock. 46 (2010) 243.
Wikipedia, Thin Film, Jul. 8, 2011, http://en.wikipedia.org/w/index.php?title=Thin_film&oldid=438412732.
Wei et al. Reaction in Ni-Al Laminates by Laser-Shock Compression and Spalling, Acta Materialia 59 (2011) 5276-5287.
Fritz et al. Enabling and Controlling Slow Reaction Velocities in Low-Density Compacts of Multilayer Reactive Particles. Combust. Flame. In Press (2011).
Salloum et al. Simulation of Reactive Nanolaminates Using Reduced Models: I. Basic Formulation. Combust. Flame. 157 (2010) 288.

(Continued)

*Primary Examiner* — Hsien Ming Lee
(74) *Attorney, Agent, or Firm* — Ryan, Mason & Lewis, LLP

(57) ABSTRACT

A method for modifying the chemistry or microstructure of silicon-based technology via an annealing process is provided. The method includes depositing a reactive material layer within a selected proximity to an interconnect, igniting the reactive material layer, and annealing the interconnect via heat transferred from the ignited reactive material layer. The method can also be implemented in connection with a silicide/silicon interface as well as a zone of silicon-based technology.

23 Claims, 7 Drawing Sheets

(56) References Cited

OTHER PUBLICATIONS

Fischer et al. A Survey of Combustible Metals, Thermites, and Intermetallics for Pyrotechnic Applications, 32nd AAIA/ASME/ SAE/ASEE Joint Propulsion Conference, SAND95-2448C, (1996) pp. 1-13.

Knepper et al. Effect of Varying Bilayer Spacing Distribution on Reaction Heat and Velocity in Reaction Al/Ni Multilayers, J. Appl. Phys., 105 (2009), 083504.

* cited by examiner

FIG. 3

| CONSTITUENTS | ADIABATIC $T_{max}$ (°C) | STATE OF PRODUCT | HEAT OF REACTION | |
|---|---|---|---|---|
| | | | (cal/g) | (cal/cc) |
| Si + 6B | 230 | SOLID | 76.4 | 177 |
| 3Al + Ta | 392 | SOLID | 35.9 | 230 |
| 3Si + 5Mo | 515 | SOLID | 43.1 | 279 |
| Cu + Pd | 600 | SOLID | 44.5 | 472 |
| Si + Cr | 958 | SOLID | 159 | 684 |
| Si + Ni | ~1000 | SOLID-LIQUID | 235 | 1140 |
| Al + 3Ni | 1251 | SOLID | 180 | 1230 |
| Si + Fe | 1386 | SOLID | 225 | 1020 |
| Si + Co | 1460 | SOLID-LIQUID | 299 | 1450 |
| Si + 2Ta | 1563 | SOLID | 76.9 | 907 |
| Al + Ni | 1638 | SOLID-LIQUID | 330 | 1710 |

ANNEALING COPPER INTERCONNECTS

FIELD OF THE INVENTION

Embodiments of the invention generally relate to the rapid annealing of silicon-based electronic devices and, more particularly, to interconnects and dopant profiles.

BACKGROUND OF THE INVENTION

Metallic interconnects can suffer from failure due to electromigration (EM) when exposed to high current densities. EM occurs primarily along interfaces such as grain boundaries or phase boundaries and to a lesser degree in the bulk (grain). Attempts at improving EM resistance have included using metal alloys with precipitates at the interfaces, capping the interconnect with a rigid material to resist EM surface diffusion, and using alloys and deposition techniques that can deposit large contiguous grains referred to as "bamboo grains."

These existing approaches, however, are based on using the as-deposited microstructure with little change beyond typical thermal annealing from sources external to the chip (for example, an oven or a laser).

Thermal anneals, often with excursions to much higher temperatures, are also used in other aspects of silicon technology such as a modification of dopant profiles, a relaxation or build up of stress, or an increase in the adhesion between layers. These material properties are typically improved through a difficult engineering of the thermal history that allows for the nanometric controlling of diffusion in materials. Thermal anneals are also needed to engineer contacts.

As scaling of devices continues, the contact area is becoming sufficiently small that the intrinsic contact resistivity of the Si/Silicide interface can dominate the external resistance of a device. By way of example, at a typical contact resistivity value of $10^{-8}$ $\Omega$-cm$^2$, a contact length of 10 nm represents 100 $\Omega$-$\mu$m per interface, which represents more than the entire external resistance budget for a device. Reducing the intrinsic contact resistivity to improve the device performance could be accomplished, for instance, by annealing the interface and allowing for selected impurities to diffuse to the interface. A relatively high thermal budget might be required to achieve such a low interfacial resistivity.

However, other elements of the devices or integrated circuits may not be in a position to withstand such an anneal. In this particular application, there is a need for anneal techniques that deliver heat locally to the element that can benefit from it without damaging other components that are sensitive to the thermal budget.

SUMMARY OF THE INVENTION

In one aspect of the invention, a method for annealing a copper interconnect is provided. The method includes the steps of depositing a reactive material layer within a selected proximity to an interconnect, igniting the reactive material layer, and annealing the copper interconnect via heat transferred from the ignited reactive material layer.

Another aspect of the invention includes modifying a silicide/silicon interface without damaging a metal gate, via steps of depositing a reactive material layer within a selected proximity to the silicide/silicon interface, igniting the reactive material layer, and annealing the silicide/silicon interface via heat transferred from the ignited reactive material layer.

Yet another aspect of the invention includes the controlled annealing of a specified zone of silicon-based technology, via steps of depositing a reactive material layer within a selected proximity to a zone of silicon-based technology to be annealed, igniting the reactive material layer, and annealing the zone of silicon-based technology to be annealed via heat transferred from the ignited reactive material layer.

These and other objects, features and advantages of the present invention will become apparent from the following detailed description of illustrative embodiments thereof, which is to be read in connection with the accompanying drawings.

BRIEF DESCRIPTION OF THE DRAWINGS

FIG. 3 is a table listing some of the properties of selected metallic reactive material systems, according to an embodiment of the present invention;

DETAILED DESCRIPTION OF EMBODIMENTS

An aspect of the invention includes annealing interconnects, for example copper-based interconnects, in the back-end-of-line (BEOL) levels of microchip circuitry. The techniques described herein include a process which modifies an interconnect microstructure after deposition by annealing the metal using a local chemical energy source. The local energy source confines the area annealed to specific, pre-determined, regions, and avoids subjecting the entire volume to an anneal (for example, in a rapid thermal annealing (RTA) or an annealing furnace or oven). The chemically generated anneal results in selective grain growth which can be carried out in such a manner as to obtain a higher density of bamboo grains or localized larger grains, which inhibit EM.

In one or more embodiments of the invention, the chemical energy source is a multilayered metallic system known as a reactive material (RM). Reactive material is a class of materials which includes two or more reactants (typically metals, semimetals, ceramics or oxides) that can react to release heat without producing gaseous products or generating a large pressure wave. The ability to release a large amount of heat without a pressure wave separates reactive materials from explosive materials and allows RMs to be utilized in specialized applications. In one or more aspects of the invention, such a RM can include, for example, layers of Ni and Al denoted Ni/Al, which is deposited in close proximity to a copper-based interconnect. The RM can be ignited from a laser pulse, electrical pulse, or other similar energy source. Upon ignition, the RM's chemical energy is transformed into heat, which can be directed into the interconnect. In turn, the copper grains will grow and can result in an increased grain or bamboo microstructure which is more resistant to EM.

The RM can be deposited, for example, above the interconnect and then removed, or beneath/around the interconnect to achieve better heating of the bottom of the interconnect. This technique is applicable to either blanket or patterned features, allowing the local microstructure to be tailored to improve desired properties such as, for example, electrical (EM, resistivity) and mechanical (stress).

Figure 1:
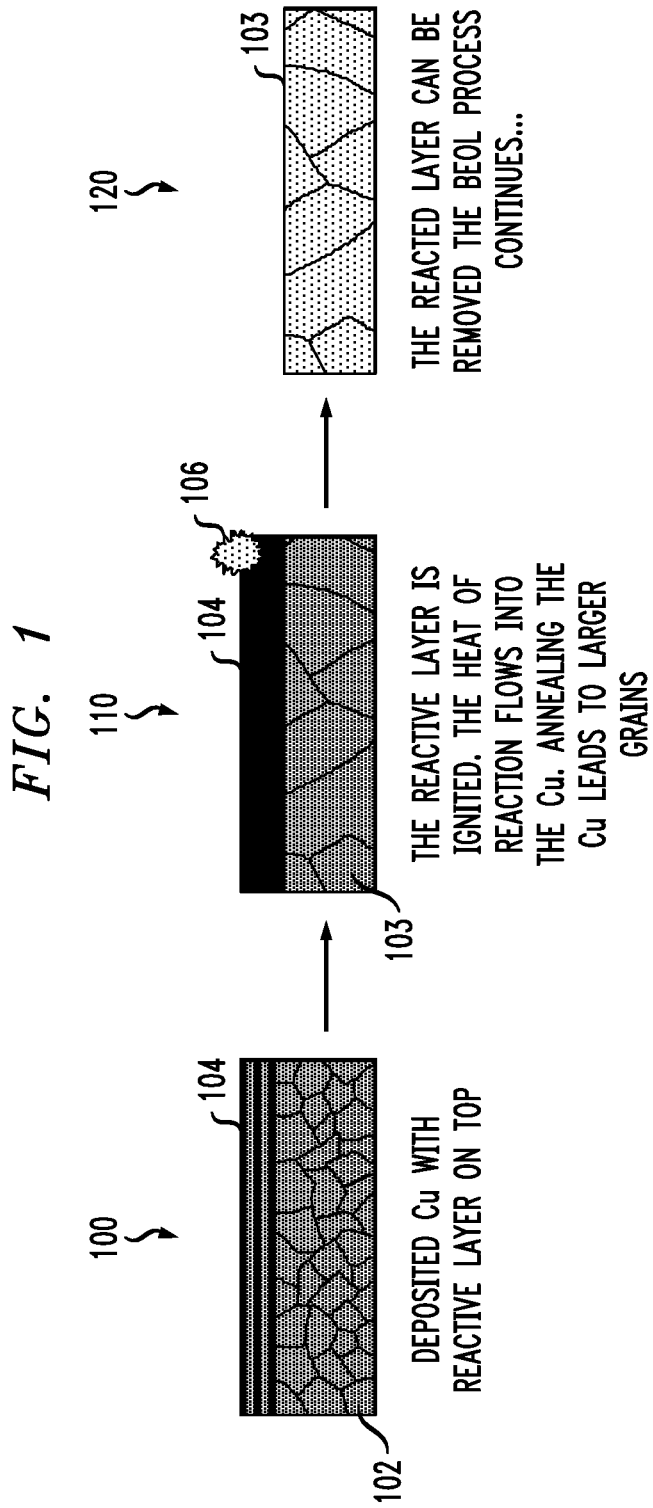
FIG. 1 is a flow diagram illustrating depositing, igniting and annealing, and removing the reactive material (RM) layer, according to an embodiment of the present invention.

FIG. 1 is a diagram illustrating depositing a RM layer on a copper film, according to an embodiment of the present invention. By way of illustration, FIG. 1 depicts steps 100, 110 and 120. In step 100, a RM layer 104 is deposited on top of a copper film 102. In step 110, the RM layer 104 is ignited (as illustrated by ignition image 106). Reactive materials that can sustain very high heating rates on the order of $10^6$-$10^{7\circ}$ C./s have been studied by Barron et al., Journal of Applied Physics, 109 (2011) 013519 and Trenkle et al, J. Appl. Phys. 107 (2010) 113511. The heat of the RM layer 104 flows into the copper film, annealing the copper leads to larger grains 103. Further, in step 120, the RM layer is removed from the copper film 103, and the BEOL process continues.

Figure 2:
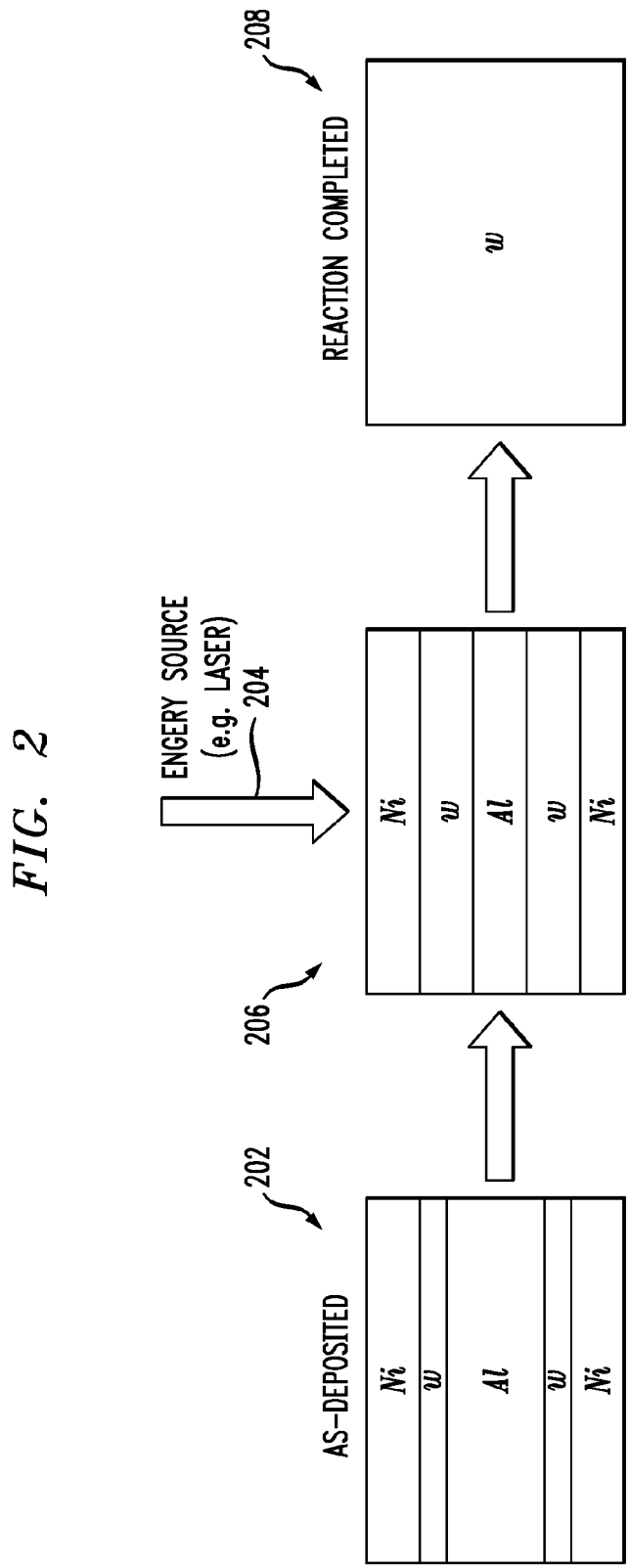
FIG. 2 is a diagram illustrating the reaction within a layer of a reactive material, according to an embodiment of the present invention.

FIG. 2 is a diagram illustrating the reaction within a layer of a reactive material, according to an embodiment of the present invention. By way of illustration, FIG. 2 depicts the as-deposited microstructure 202, where a pre-reaction intermixed thickness w separates the reactants Ni and Al. FIG. 2 also depicts a microstructure in the midst of reacting 206 as a result of being heated by an external energy source 204, and the final microstructure 208 when the reaction has consumed all the reactants.

FIG. 3 is a table 302 listing some of the properties of selected metallic reactive material systems, according to an embodiment of the present invention. The table has been shown, for example, in Fischer et al., 32nd AIAA/ASME/SAE/ASEE. Joint Conference and Exhibit (Lake Buena Vista, Fla. 1996 Jul. 1-3. SAND95-2448C). The data in table 302 shows that the adiabatic temperature and the heat of reaction can be significantly varied by utilizing different reactants. In particular, silicon-based reactions (italics) are available with a combination of materials that are readily used or easily integrated in the BEOL. Notice that the Al+3Ni reaction is not as energetic as the Al+Ni reaction, indicating that the heat of reaction can be modified within a selection of reactants. This notion will be expanded in FIG. 4.

Figure 4:
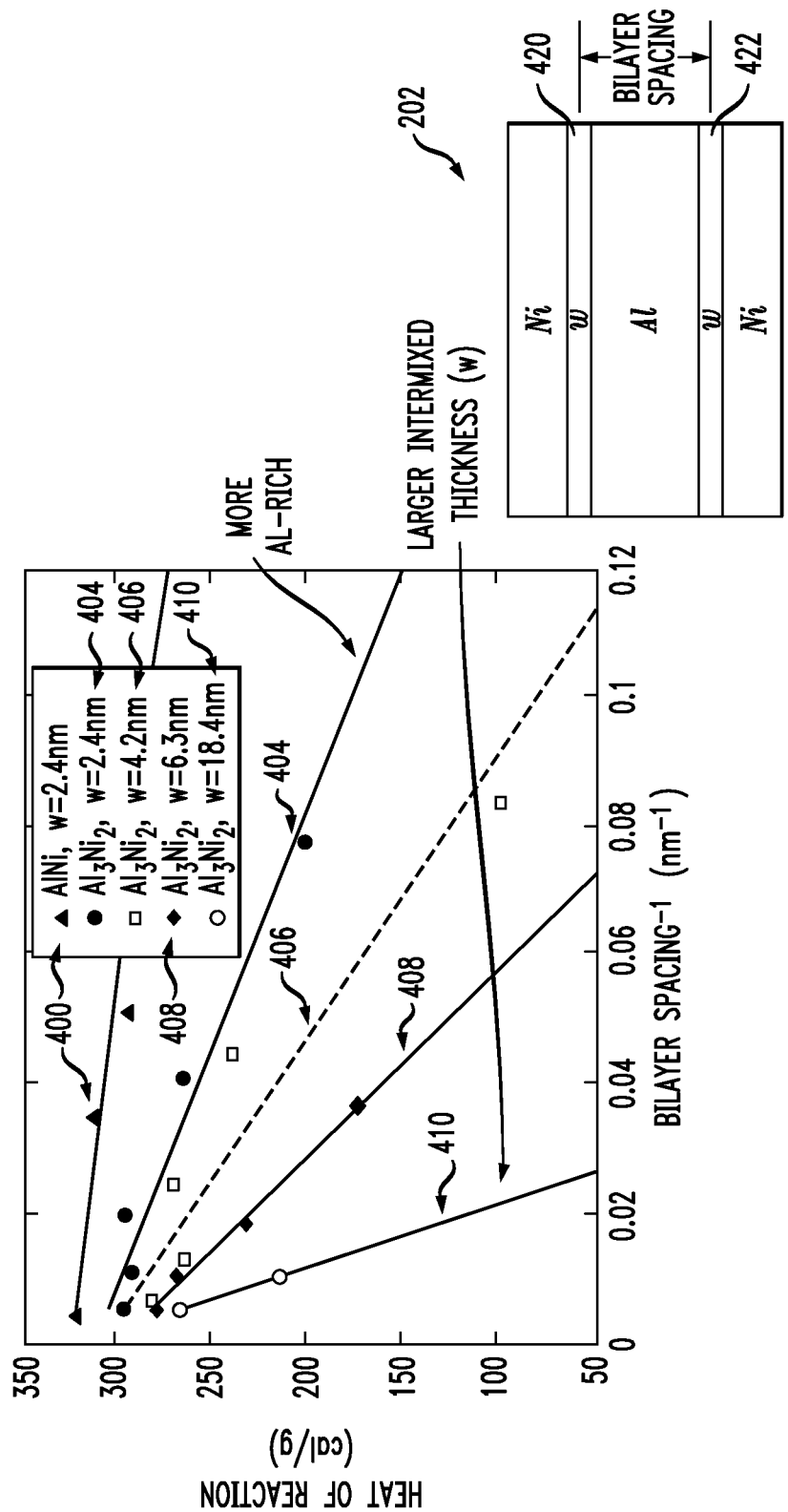
FIG. 4 is a graph illustrating heat release of reactive materials, according to an embodiment of the present invention.

FIG. 4 is a graph illustrating heat release of reactive materials (as well as the representation of the as-deposited microstructure 202 as seen in FIG. 2), according to an embodiment of the present invention. Reactive laminate materials that include two reactants are frequently characterized by a bilayer spacing which is the total thickness of both reactant layers. As depicted in FIG. 4, the two pre-reaction intermixed thickness (w) layers 420 and 422 each include a thickness relative to the bilayer spacing and affect the total stored heat of the reactive multilayer. The graph has been detailed, for example, in Salloum et al., Combust Flame, 157 (2010) 288; Gavens et al., J. Appl. Phys., 87 (2000) 1255; as well as Knepper et al., J. Appl. Phys., 105 (2009) 083504. By way of illustration, FIG. 4 depicts the heat of reaction of Ni/Al-based reactive material systems. The data lines 402 and 404 show that the heat of reaction can be modified by varying the atomic ratio of the reactants (Al:Ni) from 1:1 to 3:2 for a given length of the pre-reaction intermixed thickness (w=2.4 nm). Data lines 406, 408 and 410 show additional results with modified variables. Furthermore, the microstructure can be modified by growing the pre-reaction intermixed thickness, which decreases the heat of reaction for a given bilayer spacing. For a given atomic ratio and pre-reaction intermixed thickness, the heat of reaction has been shown to decrease with decreasing reactant spacing due to the increasing volume fraction of the pre-reaction intermixed thickness. Modifying the atomic ratio of the reactants, the thickness of the pre-reaction intermixed thickness, or the bilayer spacing can be used to optimize the heat required for a particular anneal.

Figure 5:
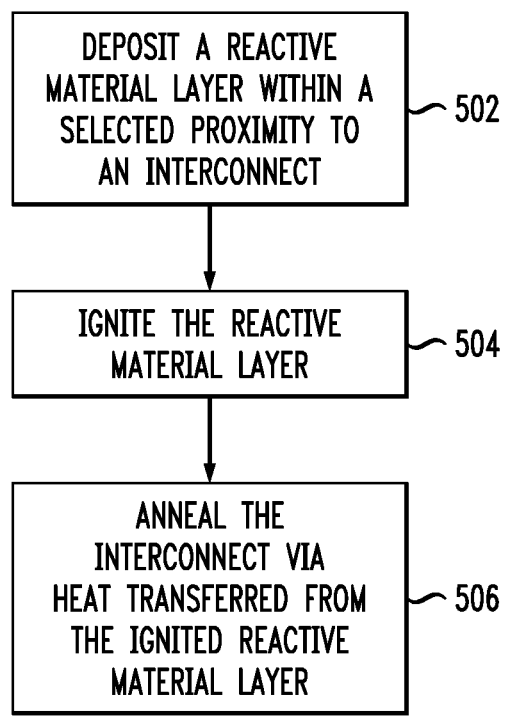
FIG. 5 is a flow diagram illustrating techniques for annealing an interconnect, according to an embodiment of the present invention.

FIG. 5 is a flow diagram illustrating techniques for annealing an interconnect (for example, a copper or copper-based interconnect), according to an embodiment of the present invention. Step 502 includes depositing a reactive material layer within a selected proximity to an interconnect (above, beneath or around the interconnect). In one aspect of the invention, a selected proximity can include in contact with or within one µm of the interconnect. The reactive material layer confines an area to be annealed to a pre-determined region by patterning. For example, the reactive material can be patterned to device size of 130 nm pitch for the 32 nm node. The reactive material layer can include one or more layered metallic, semi-metallic, or oxide reactants (for example, Ni/Al, Cu/Pd, Si/Cr or $SiO_2$/Al). Additionally, the reactive material layer can include one or more layers of metallic reactants with a repeat period ranging from 1 nm to 15 µm.

Step 504 includes igniting the reactive material layer. Igniting the reactive material layer can include igniting the reactive layer via a laser pulse, via an electrical pulse, etc.

Step 506 includes annealing the interconnect via heat transferred from the ignited reactive material layer. Annealing the copper interconnect via heat transferred from the ignited reactive material layer includes generating grain growth. Grain growth occurs as a result of being heated and is affected by the heating rate. Accordingly, one aspect of the invention includes the use of high power anneals utilizing the rapid heat release of reactive materials.

The techniques depicted in FIG. 5 can also include removing the reactive material layer. The material can be removed, for example, by chemical-mechanical polish, a chemical etch, or a mechanical polish.

Figure 6:
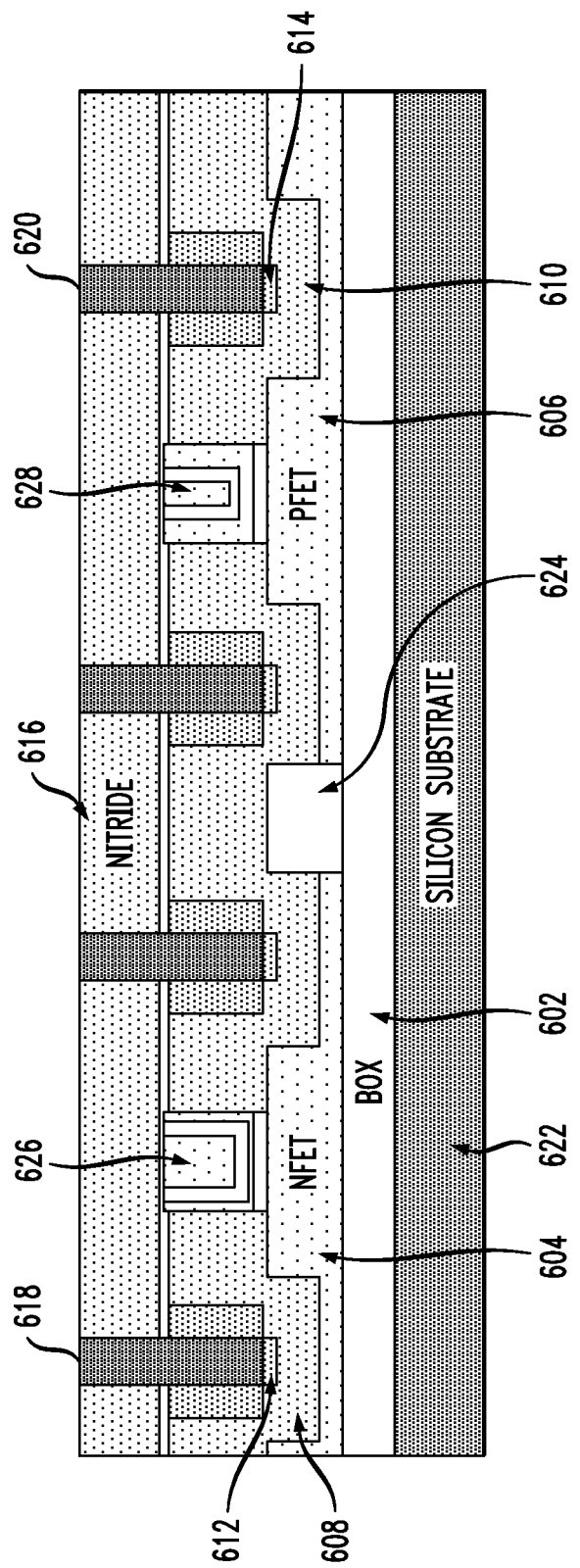
FIG. 6 is a diagram illustrating a silicon-based electronic device, according to an embodiment of the present invention.

FIG. 6 is a diagram illustrating a silicon-based electronic device, according to an embodiment of the present invention. By way of illustration, FIG. 6 depicts a device configuration based on silicon-on-insulator (SOI) substrate technology, including a buried oxide (BOX) layer 602 above a Si substrate 622, an NFET 604, an NFET gate 626, a PFET 606, a PFET gate 628, and a nitride layer 616. The NFET 604 includes a region of increased dopant concentration 608, typically arsenic (As) or phosphorus (P), which further includes a silicide 612 which contacts a reactive material component 618. Similarly, PFET 606 includes a region of increased dopant concentration 610, typically boron (B), which further includes a silicide 614 which contacts a reactive material component 620. A region of shallow trench isolation (STI), composed of silicon dioxide 624 electrically isolates the adjacent NFET and PFET regions. In an alternate embodiment of the invention, the device configuration can be manufactured using a bulk Si substrate which does not possess a BOX layer. Further, in another aspect of the invention, contacts to the silicide are built with the reactive material and the product from the reactive material remains as contact levels to later make connections.

Figure 7:
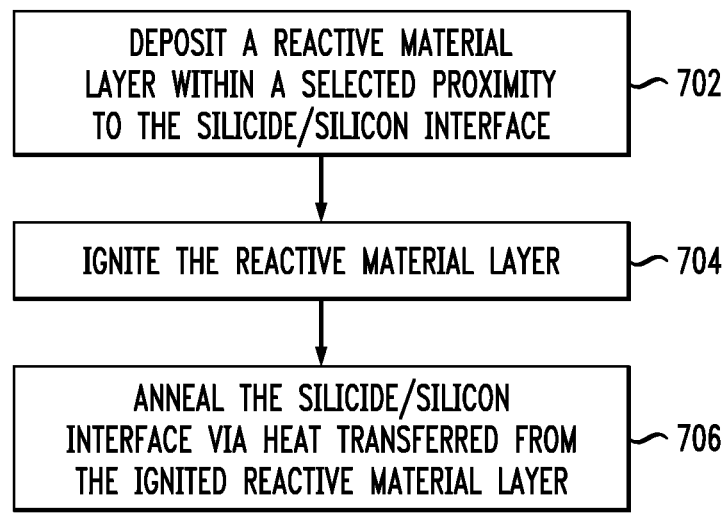
FIG. 7 is a flow diagram illustrating techniques for modifying a silicide/silicon interface without damaging a metal gate, according to an embodiment of the present invention.

FIG. 7 is a flow diagram illustrating techniques for modifying a silicide/silicon interface without damaging other parts of the device such as a metal gate, according to an embodiment of the present invention. Step 702 includes depositing a reactive material layer within a selected proximity to the silicide/silicon interface (for example, above the interface). In one aspect of the invention, a selected proximity of the reactive material to the Si/Silicide interface can be closer than the proximity of the reactive material to the metal gate or other area of the chip which would be damaged by the full anneal. The reactive material layer confines an area to be annealed to a pre-determined region by patterning. Additionally, as noted herein, the reactive material layer can include one or more layered metallic, semi-metallic, or oxide reactants (for example, Ni/Al, Si/Cr or $SiO_2$/Al). Additionally, the reactive material layer can include one or more layers of metallic reactants with a repeat period ranging from 1 nm to 15 μm, although for many applications a balance of heat and ignition sensitivity can be achieved for a repeat period ranging from 20 nm to 0.1 μm.

Step 704 includes igniting the reactive material layer. Step 706 includes annealing the silicide/silicon interface via heat transferred from the ignited reactive material layer.

The techniques depicted in FIG. 7 also include selecting a reactive material system with an appropriate heat such that the silicide/silicon interface can be engineered without damaging a metal gate. An aspect of the invention additionally includes removing the reactive material layer. The material can be removed, for example, by chemical-mechanical polish, a chemical etch, or a mechanical polish.

Figure 8:
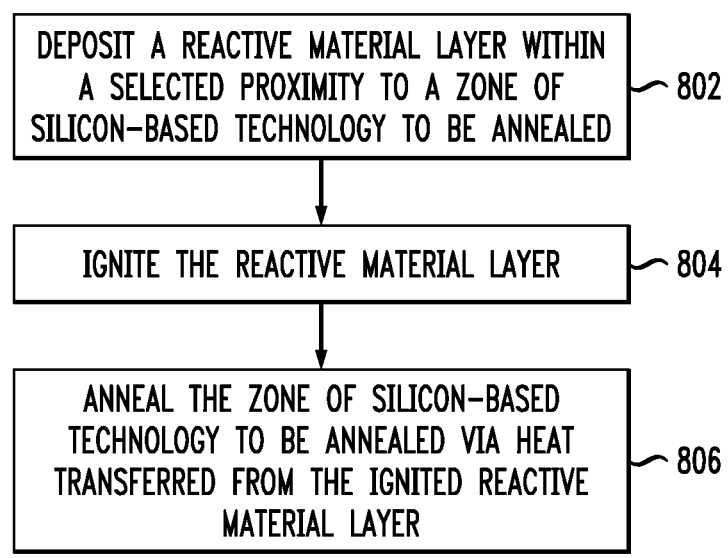
FIG. 8 is a flow diagram illustrating techniques for annealing a zone of silicon-based technology, according to an embodiment of the present invention.

FIG. 8 is a flow diagram illustrating techniques for annealing a zone of silicon-based technology, according to an embodiment of the present invention. For example, an annealed zone can be a metal layer that will undergo grain growth for lower resistance. The annealed zone can be, for instance, a dielectric that will become denser and more resistant to etching, dopants in silicon that can be more completely activated, or interfaces for which a precipitated layer can change the chemistry (work function, barrier height, diffusion barrier properties, shut down fast diffusion interface paths, etc.). Step 802 includes depositing a reactive material layer within a selected proximity to a zone of silicon-based technology to be annealed. In one aspect of the invention, a selected proximity can include in contact with or within one μm of the interconnect. Step 804 includes igniting the reactive material layer.

Step 806 includes annealing the zone of silicon-based technology to be annealed via heat transferred from the ignited reactive material layer. Annealing the zone of silicon-based technology includes annealing the zone without excessively heating a nearby material that would be adversely affected by heating (such as an aluminum gate). In one or more aspects of the invention, the RM's heat of reaction is modified (or fine-tuned) using the techniques described herein to provide a suitable amount of energy that will be absorbed by the nearby material while not resulting in an excessive increase in temperature at the gate (a known distance away). In a configuration such as, for example, detailed herein, the size of the annealed zone can range from a few nanometers away from the reactive material for less energetic reactive material chemistry utilized in small quantities, up to the bulk of a silicon wafer for highly energetic reactive material utilized in larger quantities.

According to an aspect of the invention, the total amount of heat delivered from the reactive material scales with the amount of reactive material used in a given process. Therefore, the size of the annealed zone can range from a few nanometers up to the bulk of a wafer or other similar material. One aspects in the invention includes the ability to adjust both the amount of heat used for an anneal and the volume which is annealed.

The techniques depicted in FIG. 8 can also include removing the reactive material layer by, for example, chemical mechanical polish, reactive ion etch, wet etch, etc.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method for annealing an interconnect, comprising:
    depositing a reactive material layer within a selected proximity to an interconnect, wherein the interconnect is copper or copper-based;
    igniting the reactive material layer; and
    annealing the interconnect via heat transferred from the ignited reactive material layer.

2. The method of claim 1, further comprising:
    removing the reactive material layer.

3. The method of claim 2, wherein removing the reactive material layer comprises implementing at least one of a mechanical polish, a chemical etch, a chemical-mechanical polish, and a chemical etch of an underlayer below the reactive material.

4. The method of claim 1, wherein the reactive material layer confines an area to be annealed to a pre-determined region by patterning.

5. The method of claim 1, wherein annealing the interconnect via heat transferred from the ignited reactive material layer comprises generating grain growth.

6. The method of claim 1, wherein the reactive material layer comprises one or more layered metallic, semi-metallic, or oxide reactants.

7. The method of claim 6, wherein the one or more layered metallic, semi-metallic, or oxide reactants comprises Ni/Al, Si/Cr or $SiO_2$/Al.

8. The method of claim 1, wherein the reactive material layer comprises of one or more layers of metallic reactants with a repeat period ranging from 1 nm to 15 μm.

9. The method of claim 1, wherein the reactive material layer is deposited above the interconnect, beneath the interconnect, or around the interconnect.

10. The method of claim 1, wherein igniting the reactive material layer comprises igniting the reactive layer via one of a laser pulse and an electrical pulse.

11. A method for modifying a silicide/silicon interface without damaging a metal gate, comprising:
    depositing a reactive material layer within a selected proximity to the silicide/silicon interface;
    igniting the reactive material layer; and
    annealing the silicide/silicon interface via heat transferred from the ignited reactive material layer.

12. The method of claim 11, further comprising:
    selecting a reactive material system with an appropriate heat such that the silicide/silicon interface can be engineered without damaging a metal gate.

13. The method of claim 11, wherein the reactive material layer confines an area to be annealed to a pre-determined region by patterning.

14. The method of claim 11, wherein the reactive material layer comprises one or more layered metallic, semi-metallic, or oxide reactants.

15. The method of claim 14, wherein the one or more layered metallic, semi-metallic, or oxide reactants comprises Ni/Al, Cu/Pd, Si/Cr or $SiO_2$/Al.

16. The method of claim 11, wherein the reactive material layer comprises of one or more layers of metallic reactants with a repeat period ranging from 1 nm to 15 μm.

17. The method of claim 11, wherein the reactive material layer is deposited above the silicide/silicon interface.

18. The method of claim 11, further comprising:
    removing the reactive material layer.

19. The method of claim 18, wherein removing the reactive material layer comprises implementing at least one of a mechanical polish, a chemical etch, a chemical-mechanical polish, and a chemical etch of an underlayer below the reactive material.

20. A method for annealing a zone of silicon-based technology, comprising:
    depositing a reactive material layer within a selected proximity to a zone of a silicon-based component to be annealed;
    igniting the reactive material layer; and
    annealing the zone of the silicon-based component to be annealed via heat transferred from the ignited reactive material layer.

21. The method of claim 20, wherein annealing the zone of the silicon-based component comprises annealing the zone without excessively heating a nearby material that would be adversely affected by heating.

22. The method of claim 20, further comprising:
    removing the reactive material layer.

23. The method of claim 22, wherein removing the reactive material layer comprises implementing at least one of a mechanical polish, a chemical etch, a chemical-mechanical polish, and a chemical etch of an underlayer below the reactive material.

* * * * *